United States Patent [19]

Song et al.

[11] Patent Number: 5,706,817
[45] Date of Patent: Jan. 13, 1998

[54] FILTERING METHOD FOR ULTRASONIC COLOR DOPPLER IMAGING SYSTEM

[75] Inventors: Tai-kyong Song; Jae-gyoung Kim; Cheol-an Kim, all of Seoul, Rep. of Korea

[73] Assignee: Medison Co., Ltd., Kangwon-do, Rep. of Korea

[21] Appl. No.: 646,526

[22] Filed: May 7, 1996

[30] Foreign Application Priority Data

May 8, 1995 [KR] Rep. of Korea .................. 95-11167

[51] Int. Cl.$^6$ ........................................... A61B 8/06
[52] U.S. Cl. .................. 128/661.09; 128/661.07; 128/661.08
[58] Field of Search ............. 128/661.08, 661.09, 128/661.07, 660.05

[56] References Cited

U.S. PATENT DOCUMENTS 5,269,308  12/1993  Hagiwara et al. ............... 128/661.09
5,467,770  11/1995  Smith et al. ..................... 128/661.08

*Primary Examiner*—Marvin M. Lateef
*Assistant Examiner*—Derriek Fields
*Attorney, Agent, or Firm*—Dilworth & Barrese

[57] ABSTRACT

An ultrasonic color Doppler imaging system, and particularly a filtering method for removing a clutter signal from an ultrasonic image is provided. A modified infinite impulse response (IIR) filter to which a moving target indicator (MTI) principle is applied, can sufficiently suppress an undesired transient phenomenon shown in a conventional general IIR filter, and realize a steep characteristic curve which is the same as that of the conventional IIR filter, using a small order. Thus, a frame rate of the image system can be improved and a real-time processing is possible. However, first three signals output from such a filter do not represent a characteristic of a filter accurately. Thus, first three kinds of data which cause an inaccuracy to a filter characteristic are removed from a filter processing, to render an accuracy in realization of a modified IIR filter.

8 Claims, 1 Drawing Sheet

FILTERING METHOD FOR ULTRASONIC COLOR DOPPLER IMAGING SYSTEM

BACKGROUND OF THE INVENTION

The present invention relates to an ultrasonic color Doppler imaging system, and more particularly to a filtering method for removing a low-frequency Doppler signal from an ultrasonic image.

A diagnostic system using an ultrasonic is widely used in a recent general medical area. An ultrasonic diagnostic system utilizes reflection, scattering and absorption of an ultrasonic occurring when the ultrasonic passes through a living body tissue. The scattered signal includes acoustic impedance difference information at a boundary where a scattering operation occurs and motion speed information of a scattered object. A scattering strength corresponding to intensity of an actual received signal represents difference of an acoustic impedance, and an amount of deviation of a frequency due to Doppler effect represents a motion speed, to be exact, a velocity component with respect to a proceeding direction of an ultrasonic beam.

A doppler diagnostic apparatus which is the kind of a diagnostic apparatus using an ultrasonic displays a frequency deviation amount together with a scattering strength of a signal as an image on a screen, to enable evaluation of a dynamic function of a living body. Particularly, the Doppler image system capable of displaying color images demodulates a received signal and digitizes the demodulated signal, thereby describing a flow of blood flowing through a heart or a large blood vessel into a real-time two-dimensional image. Such a color Doppler image system can display a cross-sectional image and blood flow information at the same time. To discriminate the layer image and the blood flow information, the cross-sectional image is indicated as white and black and the blood flow information is indicated as color. In this case, a flow of the blood flowing in the proceeding direction of the scanned ultrasonic beam is displayed as warm color, while a flow of the blood flowing in the inverse proceeding of the scanned ultrasonic beam is displayed as cool color, thereby expressing information with respect to the blood flow more exactly.

A Doppler signal demodulated by the above-described color Doppler imaging system includes a low-frequency Doppler signal due to a heart wall or a cardiac valve movement. Such a low-frequency Doppler signal being called a clutter signal impedes an exact detection of blood flow information. Accordingly, it is essential to remove a low-frequency Doppler signal so as to exactly detect blood flow information. A low-frequency Doppler signal due to a heart wall or cardiac valve movement is a generally very large-level direct-current component and is several hundreds of times as large in amplitude as a Doppler signal due to the blood flow. For this reason, a color Doppler imaging system uses a moving target indicator (MTI) filter which is a digital high-pass filter, to remove a clutter signal generated from a moving object. An MTI filter employs a principle of an MTI radar and uses an infinite impulse response (IIR) filter of a mainly low order. In case of a finite impulse response (FIR) filter, it is relatively easy to implement hardware compared with the IIR filter and a transient phenomenon does not appear because of a high stability with respect to a coefficient change. However, since the FIR filter has a very smooth frequency characteristic curve, it is not so easy to determine a cut-off frequency necessary for removing a low-frequency Doppler signal or a clutter signal. On the contrary, the IIR filter can in general obtain a frequency characteristic of a desired acute slope using a low order. However, since the IIR filter is poorer than the FIR filter in view of the stability with respect to the change of a coefficient value, a transient phenomenon with respect to a temporal change of an input signal is maintained long. If the transient response time of a filter becomes long, the number of data which is used for processing a filter among a data array obtained from an ultrasonic signal becomes small. Because of this point, the existing IIR filter cannot secure a frame rate needed in the Doppler imaging system, but also a real-time scanning is impossible. Referring to FIG. 1, an IIR digital high-pass filer which solves a problem relating to a transient response time will be described below.

A digital high-pass filter of FIG. 1 is a filter which uses a second-order IIR pattern. An adder 10 of FIG. 1 adds an input signal X(n) and signals fedback from coefficient multipliers 14 and 20 and outputs the added result to a memory register 12 and an adder 24. Memory register 12 delays the input signal and outputs the delayed signal $W_1(n)$ to coefficient multipliers 14 and 16 and a memory register 18, respectively. Coefficient multiplier 14 multiplies the output signal of memory register 12 by −a and supplies the multiplied result to adder 10. Memory register 18 delays the output signal of memory register 12 and outputs the delayed signal to coefficient multipliers 20 and 22. Coefficient multiplier 20 multiplies the output signal $W_2(n)$ of memory register 18 by −b and outputs the mulitplied result to adder 10. Meanwhile, coefficient multiplier 16 multiplies the output signal of memory register 12 by −2 and outputs the multiplied result to adder 24. Coefficient multiplier 22 outputs the output signal of memory register 18 to adder 24 as it is. Adder 24 adds the signals applied from adder 10 and coefficient multipliers 16 and 22 and generates a final output signal Y(n).

The IIR filter having the FIG. 1 structure uses final steady state values as initial values of the filter. As described above, since the Doppler signal due to the movement of the heart wall or cardiac valve is a very high-level DC component or low-frequency component, a magnitude of a signal to be applied at an initial condition of the FIG. 1 IIR filter can be regarded as that of a step input signal having the same magnitude as the signal initially returning from any one range gate. The magnitude of the signal to be applied at the initial condition can be calculated in a Z-domain using a transfer function of the FIG. 1 filter which is expressed as the following equation (1).

$$H(Z) = \frac{Y(Z)}{X(Z)} = \frac{1 - 2Z^{-1} + Z^{-2}}{1 + aZ^{-1} + bZ^{-2}} \quad (1)$$

To obtain initial values of two memory registers 12 and 18 in FIG. 1, the transfer functions in the Z-domain can be obtained by the following equations (2) and (3), respectively.

$$H_1(Z) = \frac{W_1(Z)}{X(Z)} = \frac{Z^{-1}}{1 + aZ^{-1} + bZ^{-2}} \quad (2)$$

$$H_2(Z) = \frac{W_2(Z)}{X(Z)} = \frac{Z^{-2}}{1 + aZ^{-1} + bZ^{-2}} \quad (3)$$

where, if a magnitude of the initially returning signal is K, output values with respect to the step input signal having the magnitude of K are expressed as the following equations (4) and (5).

$$W_1(Z) = \frac{Z^{-1}}{1+aZ^{-1}+bZ^{-2}} \times \frac{K}{1-Z^{-1}} \quad (4)$$

$$W_2(Z) = \frac{Z^{-2}}{1+aZ^{-1}+bZ^{-2}} \times \frac{K}{1-Z^{-1}} \quad (5)$$

If a final value theorem is applied to equations (4) and (5), a result expressed as the following equation (6) can be obtained.

$$\begin{aligned} W_1(\infty) &= \lim_{Z \to 1} (1-Z^{-1})W_1(Z) = W_2(\infty) = \lim_{Z \to 1} (1-Z^{-1})W_2(Z) \\ &= \frac{K}{1+a+b} \end{aligned} \quad (6)$$

Thus, a signal K which has initially returned from the respective range gates is multiplied by $1/(1+a+b)$, and the obtained values are stored in first and second memory registers 12 and 18 as initial values. Then, once a filtering process is performed a problem of the transient response time of a filter lengthening, can be solved.

However, when a cut-off frequency value of the filter is close to zero, a denominator value of the equation (6) becomes small. Accordingly, a value of K, which is the magnitude of a signal owing to an initial feedback, largely and entirely increases. Thus, to express initial conditions of memory registers 12 and 18, a number of bits are required, and a transient response phenomenon becomes more serious. As a result, since a large number of input samples are required, it is difficult to obtain a real-time image.

SUMMARY OF THE INVENTION

Therefore, to solve the above problems, it is an object of the present invention to provide a method of effectively using an output of a high-pass filter which eradicates a low-frequency Doppler signal contained in an ultrasonic Doppler signal irrespective of a cut-off frequency, for an ultrasonic Doppler image system for processing a real-time image.

To accomplish the above object of the present invention, there is provided a method for filtering an ultrasonic Doppler signal in an ultrasonic Doppler system for real-time image processing of an ultrasonic Doppler signal, including a digital high-pass filter of an infinite impulse response type which eradicates a low-frequency component contained in an ultrasonic Doppler signal irrespective of a cut-off frequency, the ultrasonic Doppler signal filtering method comprising the step of:

using only a signal filtered after the cut-off frequency for said high-pass filter is obtained, among the signals filtered by said high-pass filter, for a real-time image processing of the ultrasonic Doppler signal.

Preferably, the above filtered signal use step comprises the step of removing first three signals among the filtered signals. The above removal step performs a filtered signal removal operation every range gate.

DETAILED DESCRIPTION OF THE PREFERRED EMBODIMENT

A preferred embodiment of the present invention will be described below in more detail with reference to the accompanying drawings.

Figure 2:
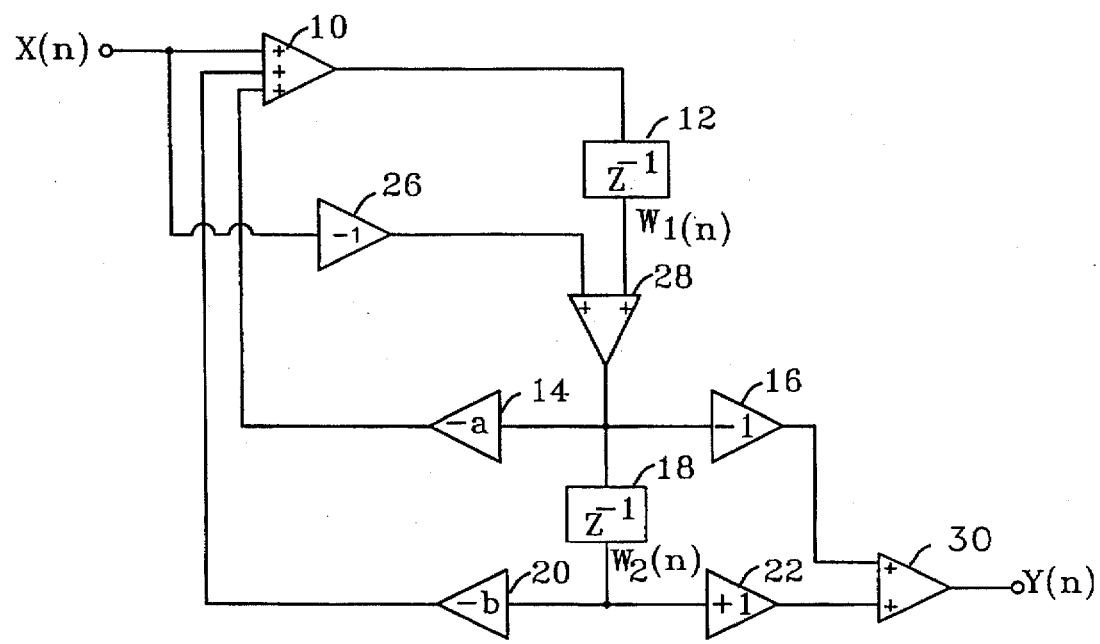
FIG. 2 is a circuit diagram of an infinite, impulse response (IIR) filter modified from the FIG. 1 filter according to the present invention.

To reduce a transient response time in the existing IIR filter, a modified IIR filter has been proposed in a paper entitled "Digital Filter In Airborne MTI Radar" by J. R. Mick in 1971. FIG. 2 shows a structure of a modified second order IIR filter based on the MTI method. In the present invention a filtering method of an ultrasonic Doppler signal using the modified second order IIR filter is proposed.

Figure 1:
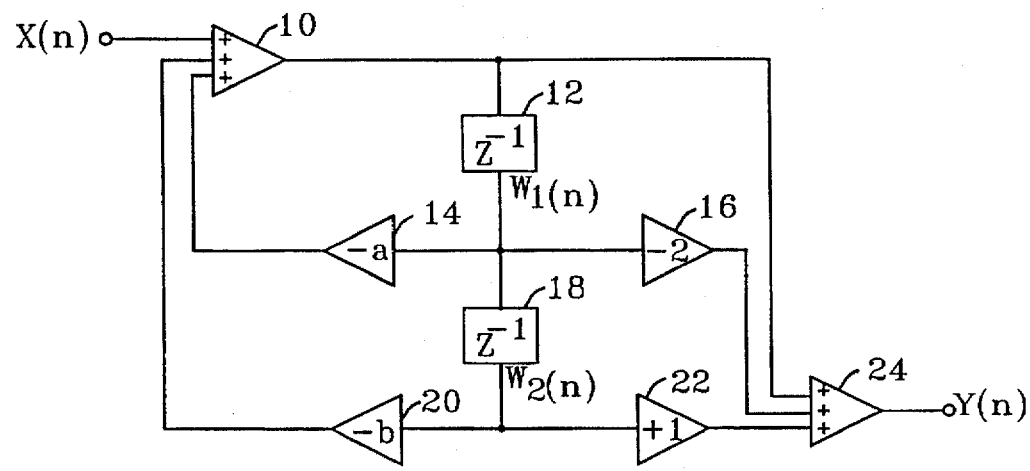
FIG. 1 is a circuit diagram of an infinite impulse response (IIR) filter for an ultrasonic Doppler image system.

In FIG. 2, the same reference numerals are used in the same elements as those of FIG. 1. A first adder 10 adds an input signal X(n) and the output signals of first and second coefficient multipliers 14 and 20. A first memory register 12 delays the output signal of first adder 10 and outputs the delayed signal to a second adder 28. A fifth coefficient multiplier 26 multiplies the input signal X(n) by −1 and outputs the multiplied signal to second adder 28. Second adder 28 adds the output signal $W_1(n)$ of first memory register 12 and the output signal of fifth coefficient multiplier 26. A third coefficient multiplier 16 multiplies the output signal of second adder 28 by −1. A third adder 30 adds the output signals of third and fourth coefficient multipliers 16 and 22 and generates a final output signal Y(n). Since first, second and fourth coefficient multipliers 14, 20 and 22 and second memory register 18 perform the same functions as those of the corresponding elements of FIG. 1, the detailed descriptions will be omitted.

A transfer function equation by a Z-transformation of the FIG. 2 filter can be expressed in the same equation as the above-described equation (1).

The outputs of memory registers 12 and 18 with respect to a signal K which initially returns from a range gate are expressed as the following equations (7) and (8) in the Z-domain, respectively.

$$W_1(Z) = \frac{Z^{-1}+aZ^{-1}+bZ^{-2}}{1+aZ^{-1}+bZ^{-2}} \times \frac{K}{1-Z^{-1}} \quad (7)$$

$$W_2(Z) = \frac{Z^{-2}-Z^{-1}}{1-aZ^{-1}+bZ^{-2}} \times \frac{K}{1-Z^{-1}} \quad (8)$$

If a final value theorem is applied to equations (7) and (8), final steady state values which are stored in memory registers 12 and 18 are K (=X(0)) and 0, respectively. Therefore, a filter processing is not performed until a value of K is applied to first memory register 12 and a value of 0 is applied to second memory register 18. Thus, the FIG. 2 IIR filter does not require a number of bits to represent an initial condition, and particularly can perfectly remove a transient response time with respect to a step input generated in an ultrasonic color Doppler signal. However, some disadvantages still exist even in the modified IIR filter of FIG. 2.

The output Y(n) of the FIG. 2 filter is expressed as the following equation (9).

$$Y(n) = X(n) - W_1(n) + W_2(n) \quad (9)$$

where, $$W_1(n) = X(n-1) - a\{W_1(n-1) - X(n-1)\} - bW_2(n) \quad (10)$$

$$W_2(n) = W_1(n) - X(n-1) \quad (11)$$

Using equations (10) and (11), equation (9) is expressed again as follows.

$$Y(n) = X(n) - (a+2) \cdot X(n-1) + (a+1)W_1(n-1) + bW_2(n-1) \quad (12)$$

The initial output signals Y(0) and Y(1) are obtained from equation (12) as the following equations (13) and (14).

$$Y(0) = X(0) - W_1(0) + W_2(0) = 0 \quad (13)$$

$$Y(1) = X(1) - (a+2) \cdot X(0) + (a+1)W_1(0) + bW_2(0) \quad (14)$$
$$= X(1) - X(0)$$

where, $W_1(0)=X(0)$, $W_2(0)=0$.

The initial output signals Y(2) and Y(3) are obtained as the following equations (15) and (16).

$$Y(2) = X(2) - (a+2)X(1) + (a+1)X(0) \quad (15)$$

$$Y(3) = X(3) - (a+2)X(2) + (a^2 + 2a + 1 - b)X(1) - (a^2 + a - b)X(0) \quad (16)$$

$$Y(2) = X(2) - (a+2)X(1) + (a+1)X(0) \quad (15)$$

$$Y(3) = X(3) - (a+2)X(2) + (a^2 + 2a + 1 - b)X(1) - (a^2 + a - b)X(0) \quad (16)$$

As can be seen from equations (13) and (14), output signals Y(0) and Y(1) have predetermined values irrespective of characteristics of a filter, respectively. The output signal Y(2) has a problem to obtain a cut-off frequency of a desired filter because a coefficient b is omitted from Y(2). To sum up, it can be seen that a first output efficient to a filter processing becomes Y(3). Thus, the present invention removes first three outputs of such a filter in the rear filters using a predetermined program. Also, a fourth output Y(3) comes to be used for a high-pass filtering for removing a low-pass Doppler signal.

As described above, the present invention uses a structure of a modified IIR filter of FIG. 2 to remove three kinds of the initial data which cause the inaccuracy of a filter characteristic. Therefore, the present invention can real-time-process an ultrasonic Doppler signal irrespective of a cut-off frequency value of a filter, and also realize a steep characteristic curve as in that of the conventional IIR filter, using a small order and a simple initial condition, as well. Thus, the ultrasonic color Doppler imaging system using a filtering method provided in the present invention can remove a low-frequency Doppler signal contained in an ultrasonic Doppler signal more accurately, and enables a real-time processing of an image through a high frame rate.

What is claimed is:

1. A method for filtering an ultrasonic Doppler signal in an ultrasonic Doppler system for real-time image processing of an ultrasonic Doppler signal, including a digital high-pass filter of an infinite impulse response type which eradicates a low-frequency component contained in an ultrasonic Doppler signal irrespective of a cut-off frequency, said ultrasonic Doppler signal filtering method comprising the steps of:

filtering time samples of the Doppler signal to obtain corresponding samples of an output signal;

periodically removing a predetermined number of initial samples of said output signal samples; and periodically using samples of said output signal that follow said initial samples, to provide a real-time image processing of the ultrasonic Doppler signal.

2. The ultrasonic Doppler signal filtering method according to claim 1, wherein said predetermined number of initial samples of said output signal comprise three initial output signal samples.

3. The ultrasonic Doppler signal filtering method according to claim 2, wherein said removing step is performed during every range gate in the Doppler system.

4. The ultrasonic Doppler signal filtering method according to claim 1, wherein said ultrasonic signal is one reflected from a living body.

5. The ultrasonic Doppler signal filtering method according to claim 4, wherein said ultrasonic signal reflected from the living body is for diagnosing a dynamic state of a blood flow of the living body.

6. The ultrasonic Doppler signal filtering method according to claim 1, further including the step of computing the following intermediate outputs $W_1(Z)$ and $W_2(Z)$ with respect to a signal K which initially returns from a range gate:

$$W_1(Z) = \frac{Z^{-1} + aZ^{-1} + bZ^{-2}}{1 + aZ^{-1} + bZ^{-2}} \times \frac{K}{1 - Z^{-1}};$$

$$W_2(Z) = \frac{Z^{-2} - Z^{-1}}{1 + aZ^{-1} + bZ^{-2}} \times \frac{K}{1 - Z^{-1}},$$

where a and b are coefficients.

7. The method according to claim 6, wherein output samples Y(n) with respect to input samples X(n) are determined in accordance with the following equation:

$$Y(n) = X(n) - W_1(n) + W_2(n),$$

where, $$W_1(n) = X(n-1) - a\{W_1(n-1) - X(n-1)\} - bW_2(n);$$

$$W_2(n) = W_1(n) - X(n-1).$$

8. The method of claim 7, wherein the output samples Y(0), Y(1) and Y(2) are periodically removed from the filter output.

* * * * *